United States Patent
Viatella et al.

(10) Patent No.: US 8,513,045 B1
(45) Date of Patent: Aug. 20, 2013

(54) LASER SYSTEM WITH MULTIPLE LASER PULSES FOR FABRICATION OF SOLAR CELLS

(75) Inventors: John Viatella, San Mateo, CA (US); Gabriel Harley, Mountain View, CA (US); Thomas Pass, San Jose, CA (US)

(73) Assignee: SunPower Corporation, San Jose, CA (US)

(*) Notice: Subject to any disclaimer, the term of this patent is extended or adjusted under 35 U.S.C. 154(b) by 19 days.

(21) Appl. No.: 13/362,526

(22) Filed: Jan. 31, 2012

(51) Int. Cl.
*H01L 21/00* (2006.01)

(52) U.S. Cl.
USPC .......... 438/57; 438/68; 438/69; 438/71; 438/80; 438/95; 257/E21.53

(58) Field of Classification Search
None
See application file for complete search history.

(56) References Cited

U.S. PATENT DOCUMENTS

| | | | |
|---|---|---|---|
| 4,322,571 A | 3/1982 | Stanberry | |
| 5,432,015 A | 7/1995 | Wu et al. | |
| 5,738,731 A | 4/1998 | Shindo et al. | |
| 5,821,590 A | 10/1998 | Lee et al. | |
| 7,671,295 B2 * | 3/2010 | Sun et al. | 219/121.6 |
| 7,732,104 B2 | 6/2010 | Wagner | |
| 7,732,264 B2 | 6/2010 | Shih | |
| 7,759,607 B2 | 7/2010 | Chism, II | |
| 7,777,154 B2 | 8/2010 | Satoh et al. | |
| 7,781,766 B2 | 8/2010 | Shih et al. | |
| 7,799,659 B2 | 9/2010 | Pressel et al. | |
| 8,129,822 B2 | 3/2012 | Moslehi | |
| 2002/0167581 A1 | 11/2002 | Cordingley et al. | |
| 2006/0060238 A1 | 3/2006 | Hacke et al. | |
| 2006/0196535 A1 | 9/2006 | Swanson et al. | |
| 2007/0199927 A1 | 8/2007 | Gu et al. | |
| 2008/0035198 A1 | 2/2008 | Teppe et al. | |
| 2008/0157283 A1 | 7/2008 | Moslehi | |
| 2008/0299297 A1 | 12/2008 | Cousins et al. | |
| 2009/0107545 A1 | 4/2009 | Moslehi | |
| 2009/0151784 A1 | 6/2009 | Luan et al. | |
| 2009/0188553 A1 | 7/2009 | Dubin | |
| 2009/0239331 A1 | 9/2009 | Xu et al. | |
| 2009/0242522 A1 | 10/2009 | Baird et al. | |
| 2009/0308457 A1 | 12/2009 | Smith | |
| 2009/0314344 A1 | 12/2009 | Fork et al. | |
| 2010/0062560 A1 | 3/2010 | Farris, III et al. | |
| 2010/0304522 A1 | 12/2010 | Rana et al. | |
| 2011/0149281 A1 | 6/2011 | Ellis et al. | |
| 2011/0182306 A1 | 7/2011 | Hosseini et al. | |
| 2011/0300665 A1 | 12/2011 | Harley et al. | |
| 2012/0028399 A1 | 2/2012 | Moslehi et al. | |

OTHER PUBLICATIONS

Unitek Miyachi Lasers Connections, "Understanding Laser Parameters for Weld Development" Technical Application Brief, 2003, 2 sheets, vol. 1/No. 3.
Overview: Lumera Laser Products, Jan. 2009, pp. 1-12.

(Continued)

*Primary Examiner* — Kyoung Lee
(74) *Attorney, Agent, or Firm* — Okamoto & Benedicto LLP

(57) ABSTRACT

A laser system with multiple laser pulses for removing material from a solar cell being fabricated. The laser system includes a single pulse laser source and a multi-pulse generator. The multi-pulse generator receives a single pulse laser beam from the single pulse laser source and converts the single pulse laser beam into a multi-pulse laser beam. A laser scanner scans the multi-pulse laser beam onto the solar cell to remove material from the solar cell.

20 Claims, 9 Drawing Sheets

(56) References Cited

OTHER PUBLICATIONS

Beam splitter from Wikipedia, the free encyclopedia, page modified Sep. 12, 2011, 2 sheets [retrieved on Dec. 5, 2011]. Retrieved from the internet: http://en.wikipedia.org/wiki/Beam_splitter.

Wave plate from Wikipedia, the free encyclopedia, page modified Nov. 21, 2011, 2 sheets [retrieved on Dec. 5, 2011]. Retrieved from the internet: http://en.wikipedia.org/wiki/Half_wave_plate.

Polarizer from Wikipedia, the free encyclopedia, page modified Oct. 18, 2011, 12 sheets [retrieved on Dec. 5, 2011]. Retrieved from the internet: http://en.wikipedia.org/wiki/Polarizer.

International Search Report & Written Opinion of the International Searching Authority for PCT Application No. PCT/US2012/060399, Jan. 24, 2013, 8 sheets.

* cited by examiner

LASER SYSTEM WITH MULTIPLE LASER PULSES FOR FABRICATION OF SOLAR CELLS

TECHNICAL FIELD

Embodiments of the subject matter described herein relate generally to solar cell fabrication. More particularly, embodiments of the subject matter relate to apparatus and processes for fabricating solar cells.

BACKGROUND

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

The contact fingers of solar cells are formed through contact holes that expose the diffusion regions. Embodiments of the present invention provide a configurable laser system that generates a multi-pulse laser beam for removing material on a solar cell, such as to form contact holes through the material.

BRIEF SUMMARY

In one embodiment, a method of removing material from a solar cell being fabricated comprises firing a single pulse laser beam from a single pulse laser source. The single pulse laser beam is split into a first laser beam and a second laser beam. The first laser beam is directed along a first optical path and the second laser beam is directed along a second optical path, the second optical path being longer than the first optical path. The first laser beam and the second laser beam are recombined into a multi-pulse laser beam comprising a first laser pulse and a second laser pulse, the first and second laser pulses being separated by a laser pulse delay time. The multi-pulse laser beam is impinged on a material of a solar cell to remove portions of the material.

In one embodiment, a laser system for removing material from a solar cell being fabricated comprises a single pulse laser source configured to generate a single pulse laser beam, a multi-pulse generator outside a housing of the single pulse laser source, the multi-pulse generator being configured to convert the single pulse laser beam from the single pulse laser source to a multi-pulse laser beam, a laser scanner configured to scan the multi-pulse laser beam across a solar cell substrate, and a stage supporting the solar cell substrate.

In one embodiment, a method of removing material from a solar cell being fabricated comprises firing a single pulse laser beam from a single pulse laser source, the single pulse laser beam comprising a single laser pulse fired at a pulse repetition rate. The single pulse laser beam is converted into a multi-pulse laser beam comprising bursts of laser pulses at a burst repetition rate, each burst of laser pulses comprising a plurality of laser pulses. The multi-pulse laser beam is scanned onto a solar cell. The multi-pulse laser beam is impinged on a material on the solar cell to remove portions of the material.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
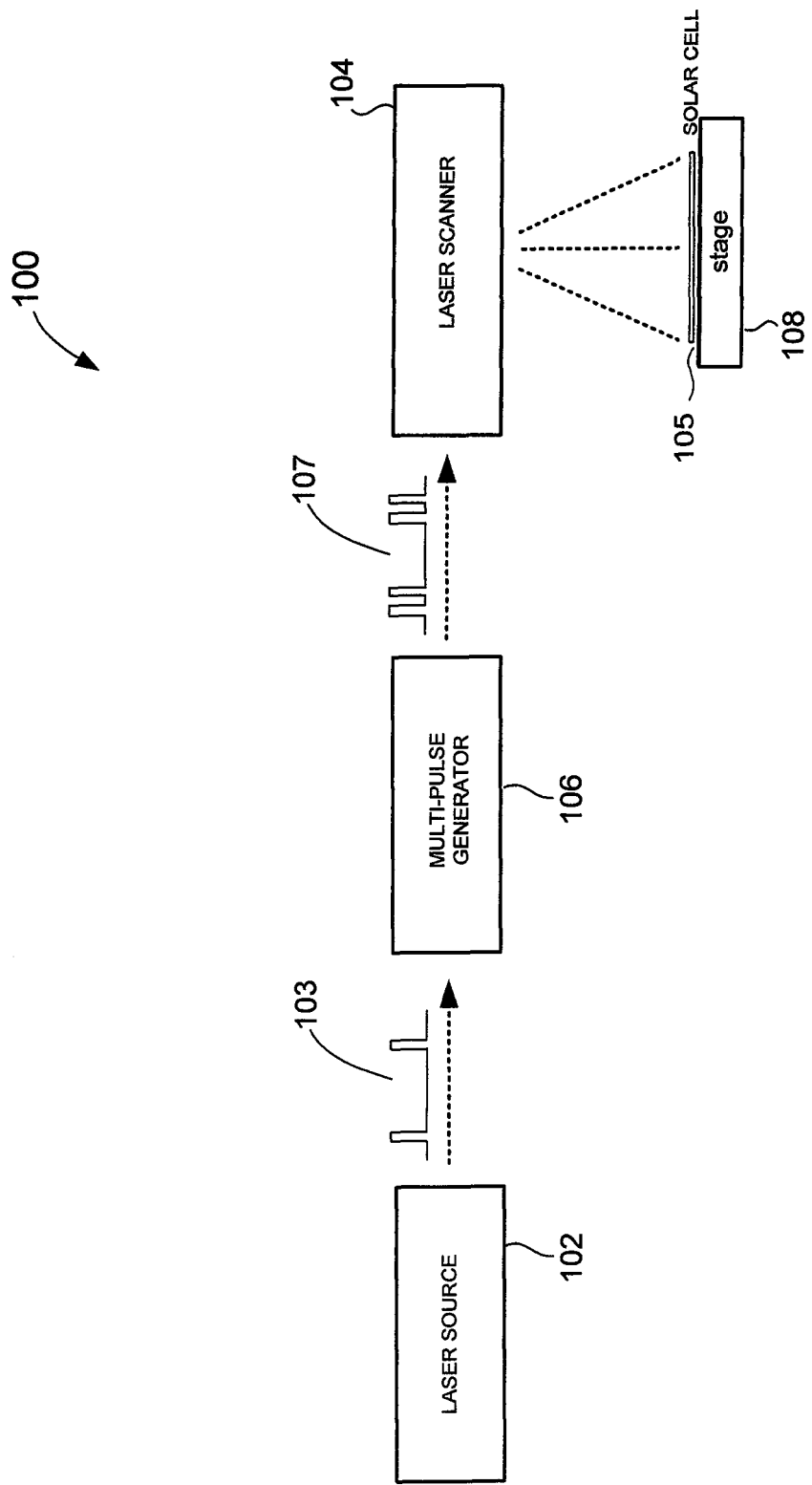
FIG. 1 is a schematic diagram illustrating a solar cell laser system for removing material from a solar cell being fabricated in accordance with an embodiment of the present invention.

FIG. 1 is a schematic diagram illustrating a solar cell laser system 100 for removing material from a solar cell being fabricated in accordance with an embodiment of the present invention. In the example of FIG. 1, the laser system 100 includes a single pulse laser source 102, a multi-pulse generator 106, a laser scanner 104, and a stage 108. The laser source 102 may be a commercially available single pulse laser source. The laser source 102 is a single pulse laser source in that it is not capable of firing multiple laser pulses in burst mode, i.e., multiple laser pulses that are fired relatively close to each other at a burst repetition rate. The laser source 102 generates a highly linearly polarized (e.g., >100:1 ratio of polarized to non-polarized light) single pulse laser beam 103 having a single laser pulse per pulse repetition rate.

Some solar cells have multiple layers through which contact holes are formed. Contact holes through these layers are preferably formed using a multi-pulse laser source. As its name implies, a multi-pulse laser source is capable of firing bursts of laser pulses at a burst repetition rate. Each burst comprises two or more laser pulses. The pulses in each burst have very short temporal distance compared to the burst repetition period. Unfortunately, multi-pulse laser sources are typically more expensive and have less availability compared to their single pulse counterparts. The multi-pulse generator 106 addresses this problem by converting a single pulse laser beam 103 from the single pulse laser source 102 to a multi-pulse laser beam 107. The multi-pulse laser beam 107 is depicted as having two laser pulses per burst for illustration purposes only. The multi-pulse generator 106 may be adapted to convert a single pulse laser beam 103 to a multi-pulse laser beam 107 with more than two laser pulses per burst.

In one embodiment, the multi-pulse generator 106 is outside the housing of the laser source 102. This advantageously allows the multi-pulse generator 106 to be configured without being constricted by the architecture of the laser source 102. Furthermore, having the multi-pulse generator 106 external and separate from the laser source 102 allow the multi-pulse generator 106 to be readily configurable to tailor the multi-pulse laser beam 107 to meet particular solar cell fabrication process needs.

The laser scanner 104 may comprise a galvanometer laser scanner, such as those commercially available from ScanLab of Germany and Cambridge Technologies. The stage 108 supports the solar cell 105 being fabricated. The stage 108 may comprise a pedestal, a chuck, or other substrate support.

In operation, the laser source 102 fires the single pulse laser beam 103 onto the multi-pulse generator 106. The multi-pulse generator 106 converts the single pulse laser beam 103 into the multi-pulse laser beam 107 for scanning by the laser scanner 104. The laser scanner 104 scans the multi-pulse laser beam 107 to impinge on a solar cell 105 being fabricated to remove materials from the solar cell 105, such as to form contact holes. The laser pulses of the laser beam 107 may form contact holes through materials on the solar cell 105 by laser ablation or laser annealing.

Figure 2:
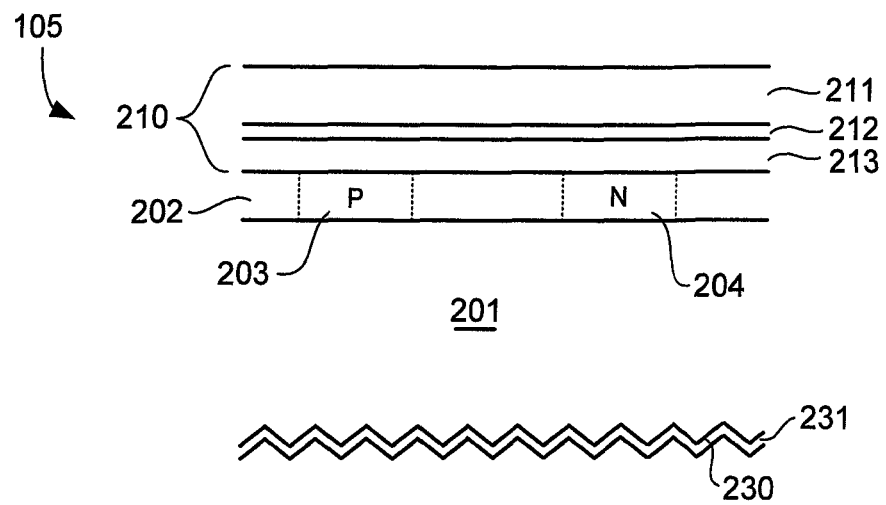
FIGS. 2-4 show cross sections of a solar cell being fabricated using the laser system of FIG. 1 in accordance with an embodiment of the present invention.

FIG. 2 shows a cross section of the solar cell 105 being fabricated in accordance with an embodiment of the present invention. In the example of FIG. 2, the solar cell 105 includes a solar cell substrate 201 comprising an N-type silicon wafer. A dielectric film stack 210 is formed on a layer 202. The film stack 210 comprises multiple layers of materials, which in the example of FIG. 2 include a film 211, a film 212, and a film 213. As shown in FIG. 2, the film 211 may be formed on the film 212, which in turn is formed on the film 213. In one embodiment, the film 211 comprises a layer of silicon nitride, the film 212 comprises a layer of amorphous silicon, and the film 213 comprises silicon dioxide.

In one embodiment, the layer 202 comprises polysilicon. A P-type diffusion region 203 and an N-type diffusion region 204 are formed in the layer 202. There are several diffusion regions in a solar cell but only one of each conductivity type is shown in FIG. 2 for clarity of illustration. The solar cell 105 is an example of a backside contact solar cell in that the diffusion regions 203 and 204, including metal contacts 221 electrically coupled to them (see FIG. 4), are formed on the backside of the solar cell over the backside of the substrate 201. The front side of the solar cell 105, which faces the sun to collect solar radiation during normal operation, is opposite the backside. In the example of FIG. 2, the front side surface of the substrate 201 is textured with random pyramids 230. An anti-reflective layer 231 comprising silicon nitride is formed on the textured surface on the front side.

Figure 3:
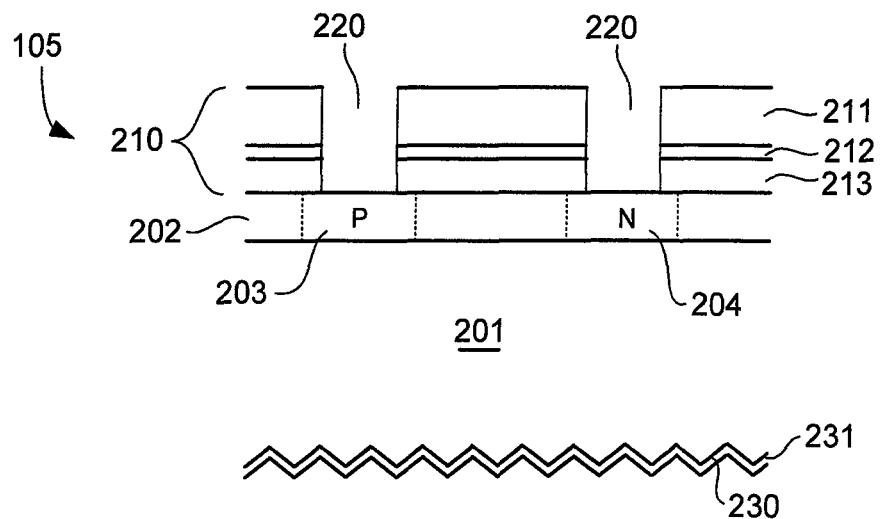
Figure 4:
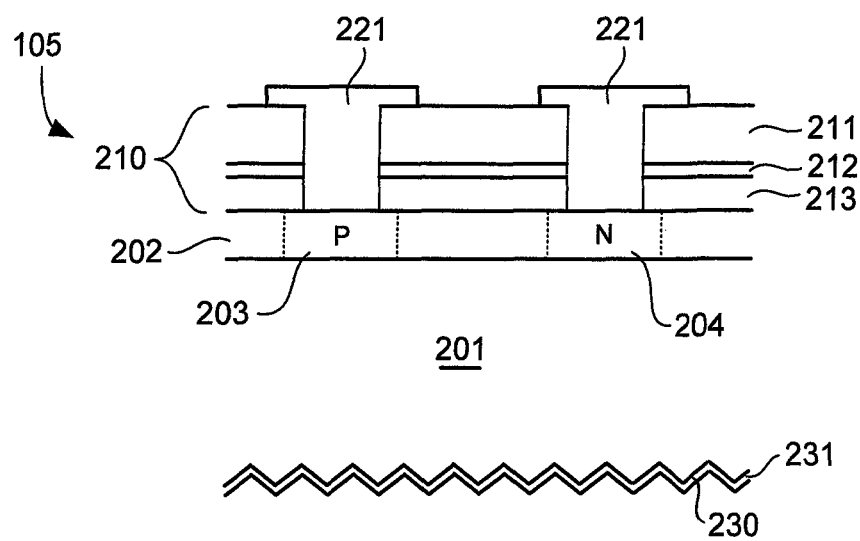

The laser system 100 may be employed to form contact holes 220 through the dielectric film stack 210 to expose the diffusion regions 203 and 204 as shown in FIG. 3. For example, a first laser pulse in a burst of laser pulses of the multi-pulse laser beam 107 may remove portions of the films 211 and 212 and a second laser pulse in the same burst of laser pulses my remove portions of the film 213 to form contact holes 220 through them. As shown in FIG. 4, metal contacts 221 are formed in the contact holes 220 to electrically connect to the diffusion regions 203 and 204.

Figure 5:
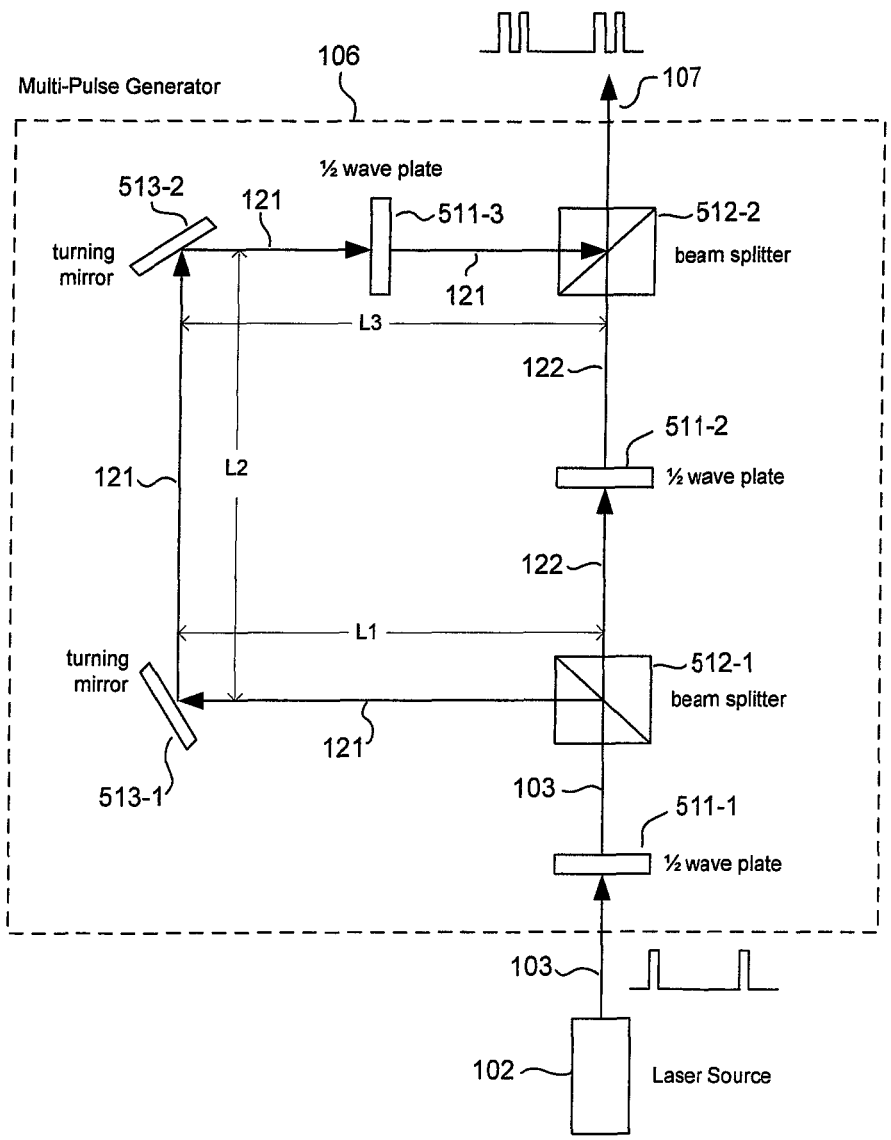
FIG. 5 is a schematic diagram of a multi-pulse generator in accordance with an embodiment of the present invention.

FIG. 5 is a schematic diagram of a multi-pulse generator 106 in accordance with an embodiment of the present invention. In the example of FIG. 5, the multi-pulse generator 106 comprises a plurality of half wave plates 511 (i.e., 511-1, 511-2, and 511-3), a plurality of polarizing beam splitters 512 (i.e., 512-1 and 512-2), and a plurality of turning mirrors 513 (i.e., 513-1 and 513-2). The just described components of the multi-pulse generator 106 may be commercially available optical components. For example, the polarizing beam splitters 512 may comprise commercially available polarizing beam splitter cubes.

The multi-pulse generator 106 receives the highly linearly polarized single pulse laser beam 103 from the single pulse laser source 102. The single pulse laser beam 103 is highly linearly polarized in that the ratio of its linearly polarized component versus non-polarized component is greater than 100:1.

Figure 6:
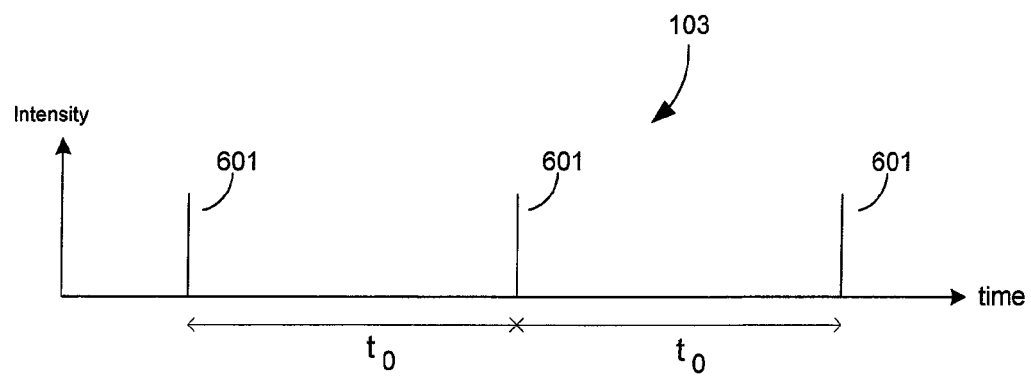
FIG. 6 shows a schematic diagram of a single pulse laser beam.
Figure 7:
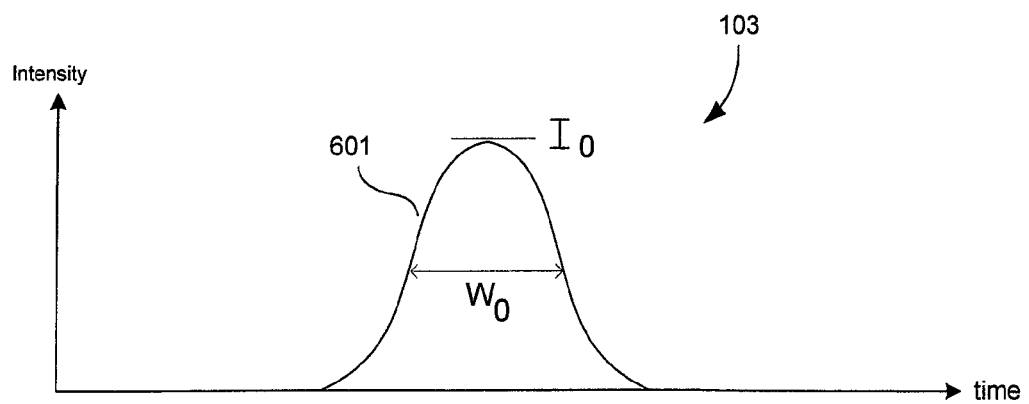
FIG. 7 shows a schematic diagram of a laser pulse in the single pulse laser beam of FIG. 6.

FIG. 6 shows a schematic diagram of the single pulse laser beam 103. The laser beam 103 includes laser pulses 601 fired by the laser source 102 at a pulse repetition rate equal to 1/t0. That is, the laser source 102 fires a single laser pulse 601 every t0 seconds (e.g., 5 micro seconds). The pulse repetition period of the laser source 102 is typically not variable or at least relatively long compared to the temporal distance between laser pulses in a burst of laser pulses of a multi-pulse laser beam. FIG. 7 shows a schematic diagram of a laser pulse 601. The laser pulse 601 has a peak intensity I0 and a pulse width W0 (e.g., 10 ps or less than 15 ps).

The half wave plates 511 rotate a polarization of an incident laser beam by half a wavelength. The half wave plates 511 may be mounted on a rotational stage to allow for rotation of the crystallographic optical axis of the half wave plates 511 and thereby adjust the angle of polarization. This allows for control of the amount of light being reflected versus transmitted (i.e., allowed to pass through in parallel with the incident laser beam) by a downstream polarizing beam splitter 512.

In the example of FIG. 5, the polarizing beam splitter 512-1 splits the laser beam 103 into a laser beam 121 and a laser beam 122. The laser beam 121 may comprise a first polarized component (e.g., the S-polarized component) of the laser beam 103 reflected by the beam splitter 512-1, while the laser beam 122 may comprise a second polarized component (e.g., the P-polarized component) of the laser beam 103 transmitted by the beam splitter 512-1, with the first and second polarized components being orthogonal. In effect, the beam splitter 512-1 directs the laser beam 121 along an extended optical path having distances L1, L2, and L3, and transmits the laser beam 122 along a normal optical path having the distance L2. The proportion of the amount of the laser beam 103 being reflected versus transmitted may be adjusted by rotating the half wave plate 511-1. In particular, rotating the crystallographic optical axis of the half wave plate 511-1 allows for adjustment of the amount, and thus the intensity, of the laser beam 121 reflected by the beam splitter 512-1 along the extended optical path relative to the laser beam 122 transmitted by the beam splitter 512-1 along the normal optical path.

The beam splitter 512-1 directs the laser beam 121 to the turning mirror 513-1, which in turn reflects the laser beam 121 to the turning mirror 513-2, through the half wave plate 511-3, and onto the beam splitter 512-2. The crystallographic optical axis of the half wave plate 511-3 may be rotated to ensure that the laser beam 121 has the correct polarization for optimum throughput entering the beam splitter 512-2. The half wave plate 511-3 thus allows for fine tuning such that the laser beam 121 entering from the extended optical path is mostly reflected by the beam splitter 512-2 to recombine with the laser beam 122 entering the beam splitter 512-2 from the normal optical path.

The laser beam 122 goes straight through the beam splitter 512-1, passes through the half wave plate 511-2, and propagates onto the beam splitter 512-2. The beam splitter 512-2, like the beam splitter 511-1, is configured to transmit a first polarized component of an incident laser beam and reflect a second polarized component of the incident laser beam, with the first and second polarized components being orthogonal. In the example of FIG. 5, the beam splitter 512-2 is configured to reflect the laser beam 121 entering from the extended optical path and to transmit the laser beam 122 entering from the normal optical path. In effect, the beam splitter 512-2 recombines the laser beams 121 and 122 into the multi-pulse laser beam 107, which is directed along a scanning optical path forward of the beam splitter 512-2. The crystallographic optical axis of the half wave plate 511-2 may be rotated to ensure that the laser beam 122 has the correct polarization for optimum throughput through the beam splitter 512-2. The half wave plate 511-2 thus allows for fine tuning such that the laser beam 122 entering from the normal optical path is mostly transmitted by the beam splitter 512-2. The half wave plates 511-2 and 511-3 may be omitted in systems where fine tuning is not required.

Each of the laser beams 121 and 122 comprises a laser pulse. In the example of FIG. 5, the laser beam 121 propagates along the extended optical path having the distance L1 from the beam splitter 512-1 to the turning mirror 513-1, the distance L2 from the turning mirror 513-1 to the turning mirror 513-2, and the distance L3 from the turning mirror 513-2 to the beam splitter 512-2. In contrast, the laser beam 122 propagates along the normal optical path having the distance L2 from the beam splitter 512-1 to the beam splitter 512-2. Because the laser beam 121 propagates along a longer optical path, the laser pulse of the laser beam 121 is delayed relative to the laser pulse of the laser beam 122. Recombining the laser beams 121 and 122 together thus results into the multi-pulse laser beam 107 comprising two laser pulses that are delayed by a laser pulse delay Δt defined by EQ. 1.

$$\Delta t = \Delta d \frac{3.3 \text{ ns}}{\text{m}} \quad \text{(EQ. 1)}$$

where,

Δd=the difference between the distance of the extended optical path and the distance of the normal optical path, and 3.3 ns/m=speed of light.

In the example of FIG. 5, $$\Delta d = L1 + L3 \quad \text{(EQ. 2)}$$

therefore, EQ. 1 may be rewritten as $$\Delta t = (L1 + L3) \frac{3.3 \text{ ns}}{\text{m}} \quad \text{(EQ. 3)}$$

where,

L1 = the distance between the beam splitter 512-1 and the turning mirror 513-1;

L2 = the distance between the turning mirror 513-2 and the beam splitter 512-2; and 3.3 ns/m = speed of light In general, the temporal separation, i.e., the laser pulse delay Δt, between the laser pulses is dictated by the difference between the distance travelled by the second (or third, etc.) pulse and the distance travelled by the first pulse, where the first pulse is of a laser beam propagating along the normal optical path and the second and subsequent pulses are of laser beams propagating along extended optical paths that are longer than the normal optical path. For every meter of distance difference, the 2nd or subsequent pulses are delayed by 3.33 ns relative to the first pulse.

Table 1 shows example calculations using EQ. 1 for various laser pulse delays Δt and corresponding optical path distance differences Δd.

TABLE 1

| Desired Laser Pulse Delay temporal separation Δt (ns) | Optical Path Distance Difference Δd (m) |
|---|---|
| 1 | 0.30 |
| 5 | 1.50 |
| 10 | 3.00 |
| 20 | 6.00 |
| 30 | 8.99 |

In the example of Table 1, a 1 ns delay between the first and second pulses of the multi-pulse laser beam 107 needs an extended optical path that is longer than the normal optical path by 0.3 m, a 5 ns delay between the first and second pulses of the multi-pulse laser beam 107 needs an extended optical path that is longer than the normal optical path by 1.5 m, etc.

As can be appreciated, the multi-pulse generator 106 may be configured to have different laser pulse delays by varying the distance of the extended optical path relative to the distance of the normal optical path. Advantageously, having the multi-pulse generator 106 external to the housing of the laser source 102 allows the designer to freely vary the distances of the extended and normal optical paths to meet particular process requirements.

Figure 8:
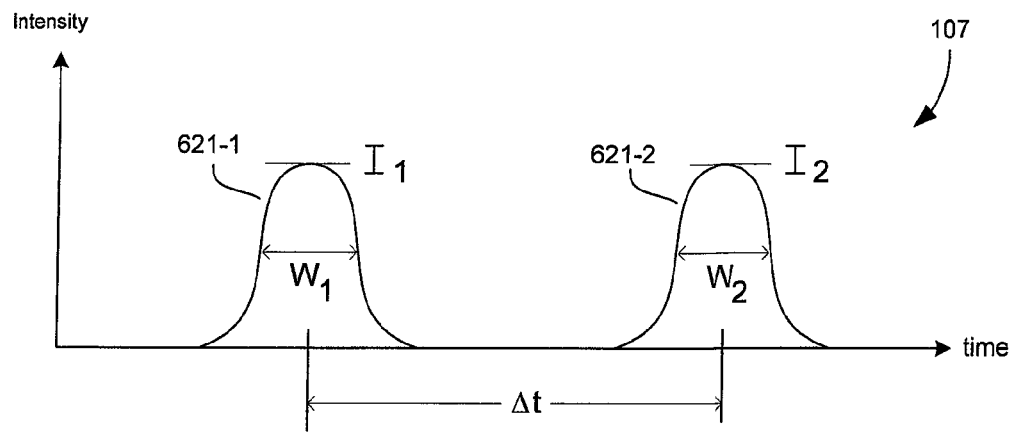
FIG. 8 shows a schematic diagram of laser pulses of a multi-pulse laser beam in accordance with an embodiment of the present invention.

FIG. 8 shows a schematic diagram of laser pulses 621 (i.e., 621-1 and 621-2) of the multi-pulse pulse laser beam 107 in accordance with an embodiment of the present invention. In the example of FIG. 8, the multi-pulse laser beam 107 has a burst of laser pulses comprising a laser pulse 621-1 having a peak intensity I1 and a pulse width W1 and a laser pulse 621-2 having a peak intensity I2 and a pulse width W2. In general, each of the pulse widths W1 and W2 is equal to the pulse width W0 of the input laser pulse 601 of the single pulse laser beam 103. The laser pulse 621-1 may be from the laser beam 122, while the laser pulse 621-2 (the delayed laser pulse) may be from the laser beam 121. The laser pulses 621 are separated by a laser pulse delay Δt, which may be varied as previously explained.

The intensity I0 of the laser pulse 601 (see FIG. 6) of the laser beam 103 limits the total of the intensities of the laser pulses of the multi-pulse laser beam 107. In general, $$I_0 = (I_1 + I_2 + \ldots I_N) \quad \text{(EQ. 4)}$$

where, $I_0$=the peak intensity of the laser pulse 601 of the single pulse laser beam 103;

$I_1$=the peak intensity of the laser pulse 621-1 of the multi-pulse laser beam 107;

$I_2$=the peak intensity of the laser pulse 621-2 of the multi-pulse laser beam 107;

$I_N$=the peak intensity of the nth laser pulse 621 of the multi-pulse laser beam 107.

EQ. 4 is for an ideal condition and does not take into account optical losses. In one embodiment where the multi-pulse laser beam 107 has two laser pulses 621 per burst, $$I_1 \cong I_2 \cong \frac{I_0}{2} \qquad (EQ.\ 5)$$

That is, each of the peak intensities of the resulting laser pulses 621-1 and 621-2 may be equal to half the peak intensity of the laser pulse 601 of the single pulse laser beam 103. It is to be noted that the intensity of the laser pulse 621-1 relative to the intensity of the laser pulse 621-2 may be varied by rotating the crystallographic optical axis of the half wave plate 511-1. For example, the crystallographic optical axis of the half wave plate 511-1 may be rotated such that the intensity I2 of the laser pulse 621-2 is less than the intensity I1 of the laser pulse 621-1, or such that the intensity I2 of the laser pulse 621-2 is greater than the intensity I1 of the laser pulse 621-1. That is, the half wave plate 511-1 may be adjusted such that $$I_1 > I_2 \qquad (EQ.\ 6)$$

or $$I_1 < I_2 \qquad (EQ.\ 7)$$

Figure 9:
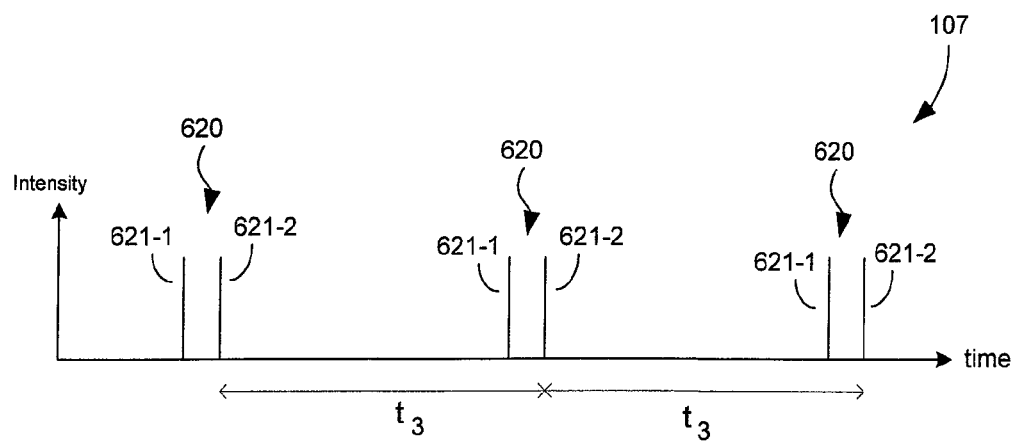
FIG. 9 shows the multi-pulse laser beam of FIG. 8 in accordance with an embodiment of the present invention.

FIG. 9 shows the multi-pulse laser beam 107 in accordance with an embodiment of the present invention. In the example of FIG. 9, the laser pulses 621-1 and 621-2 are part of a laser pulse burst 620. For each burst 620, the temporal separation of the laser pulses 621-1 and 621-2 corresponds to the laser pulse delay Δt as previously explained. The bursts 620 may be repeated at a burst repetition rate equal to 1/t3. That is, a burst 620 is generated by the multi-pulse generator 106 every t3 seconds. In one embodiment, the burst repetition period t3 is equal to the pulse period t0 of the single pulse laser beam 103. The laser pulse delay Δt is much smaller than the burst repetition period t3. For example, the laser pulse delay Δt may be 2, 2.5 or 5 micro seconds, whereas the burst repetition period t3 may be 10 ns.

Figure 10:
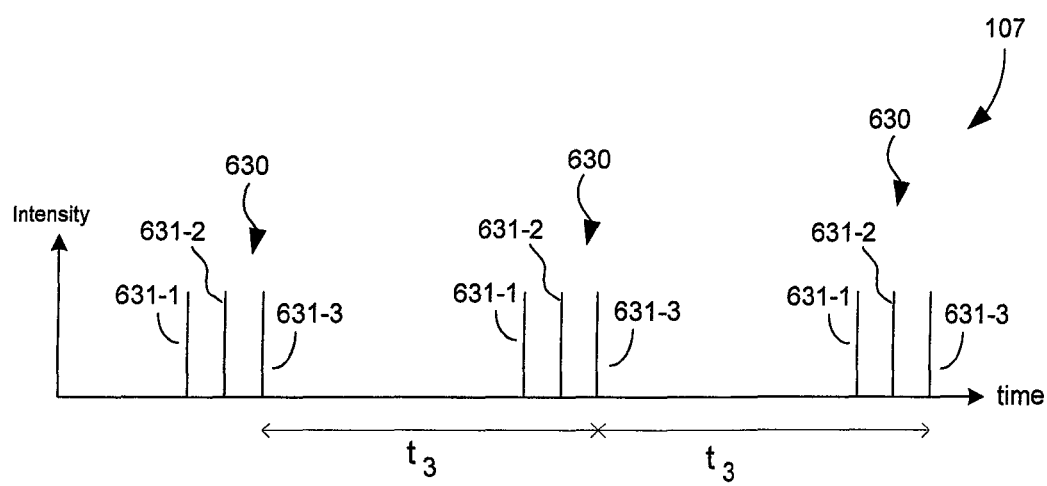
FIG. 10 shows a multi-pulse laser beam in accordance with another embodiment of the present invention.

In light of the foregoing, one of ordinary skill in the art will appreciate that the multi-pulse generator 106 may output more than two laser pulses per burst from a single laser pulse by incorporating additional optical components, such as additional half wave plates 511, turning mirrors 513, and beam splitters 512. For example, as shown in FIG. 10, the multi-pulse laser beam 107 may generate a burst 630 every t3 seconds, with each burst 630 comprising laser pulses 631-1, 631-2, 631-3 etc. The laser pulse delay Δt between laser pulses 631 may be varied by varying the optical path distance traveled by the laser pulses 631.

Figure 11:
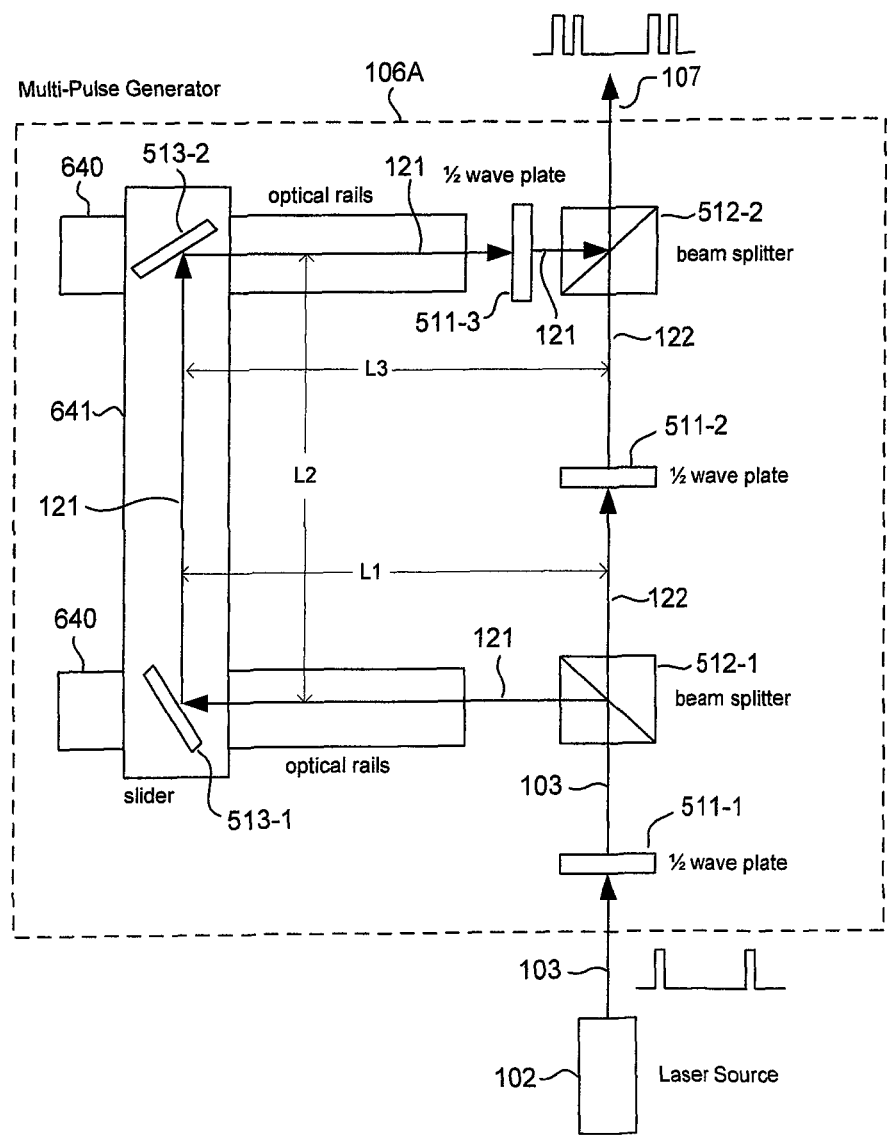
FIG. 11 is a schematic diagram of a multi-pulse generator in accordance with another embodiment of the present invention.

FIG. 11 is a schematic diagram of a multi-pulse generator 106A in accordance with another embodiment of the present invention. The multi-pulse generator 106A is a particular embodiment of the multi-pulse generator 106 of FIG. 5. In the example of FIG. 11, the multi-pulse generator 106A comprises the plurality of half wave plates 511, the plurality of beam splitters 512, and the plurality of turning mirrors 513. In addition, the multi-pulse generator 106A further includes a carriage assembly comprising optical rails 640 and a slider 641. The turning mirrors 513 may be mounted on the slider 641, which movably rides on the optical rails 640. The slider 641 may slide on the optical rails 640 to move the turning mirrors 513 and vary the distances L1 and L3, thus varying the extended optical path distance travelled by the laser beam 121. The optical path distance traveled by the laser beam 121 affects the laser pulse delay Δt between the laser pulses of the multi-pulse laser beam 107 as previously explained. The slider 641 may thus be readily adjusted to generate the multi-pulse laser beam 107 with a laser pulse delay Δt tailored to remove particular materials from a solar cell substrate 105. The multi-pulse generator 106A otherwise works in the same manner as the multi-pulse generator 106.

Figure 12:
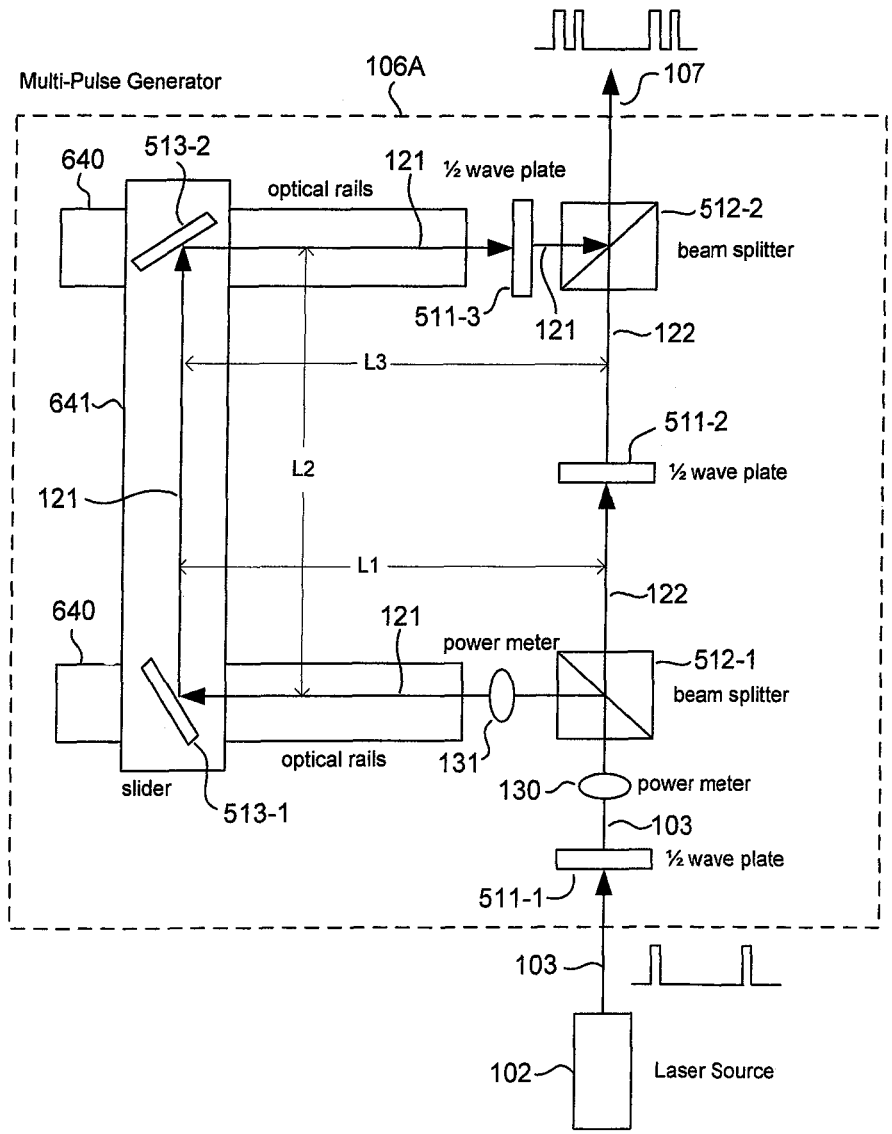
FIG. 12 is a schematic diagram of the multi-pulse generator of FIG. 11 with power meters, in accordance with an embodiment of the present invention.

As previously explained, the proportion of the intensity of the laser beam 121 relative to the laser beam 122 may be adjusted by rotating the crystallographic optical axis of the half wave plate 511-1. Also, the distance of the extended optical path relative to the distance of the normal path may be varied to adjust the laser pulse delay between pulses of the multi-pulse laser beam 107. FIG. 12 shows a schematic diagram of the multi-pulse generator 106A with power meters 130 and 131, illustrating how the intensities of the laser pulses and delay between the laser pulses of the multi-pulse laser beam 107 may be adjusted in accordance with an embodiment of the present invention.

In the example of FIG. 12, a power meter 130 is placed inline with the laser beam 103 and a power meter 131 is placed inline with the laser beam 121. The power meters 130 and 131 provide a reading of the power of an incident laser beam. To obtain a 50/50 intensity split with a 10 ns laser pulse delay between the laser pulses of the multi-pulse laser beam 107, the half wave plate 511-1 is adjusted such that the power meters 130 and 131 provide the same power reading. Then, the slider 641 is moved such that the distance L1 plus the distance L3 is equal to 3 meters. From EQ. 3, this results in a laser pulse delay time of 10 ns between the laser pulses.

As another example, to obtain an 80/20 intensity split with a 15 ns laser pulse delay between the first and second laser pulses of the multi-pulse laser beam 107, the half wave plate 511-1 is adjusted such that the power meter 131 provides a power reading that is 20% of the power reading provided by the power meter 130. The slider 641 is then moved such that the distance L1 plus the distance L3 is equal to 4.5 meters. From EQ. 3, this results in a laser pulse delay time of 15 ns between the first and second laser pulses.

Laser systems with multiple laser pulses for fabrication of solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of removing material from a solar cell being fabricated, the method comprising:
    firing a single pulse laser beam from a single pulse laser source;
    splitting the single pulse laser beam into a first laser beam and a second laser beam;
    directing the first laser beam along a first optical path;
    directing the second laser beam along a second optical path, the second optical path being longer than the first optical path;
    recombining the first laser beam and the second laser beam into a multi-pulse laser beam comprising a first laser pulse and a second laser pulse, the first and second laser pulses being separated by a laser pulse delay time; and
    impinging the multi-pulse laser beam on a material of a solar cell to remove portions of the material.

2. The method of claim 1 further comprising:
    directing the single pulse laser beam through a first wave plate; and after directing the single pulse laser beam through the first wave plate, splitting the single pulse laser beam into the first and second laser beams using a first beam splitter.

3. The method of claim 2 further comprising:
reflecting the second laser beam from the first beam splitter and onto a first turning mirror on the second optical path.

4. The method of claim 3 further comprising:
reflecting the second laser beam from the first turning mirror to a second turning mirror on the second optical path; and
directing the second laser beam from the second turning mirror, through a second wave plate, and onto a second beam splitter.

5. The method of claim 4 further comprising:
transmitting the first laser beam through the first beam splitter, through a second wave plate, and onto the second beam splitter.

6. The method of claim 5 wherein the second beam splitter recombines the first laser beam and the second laser beam into the multi-pulse laser beam.

7. The method of claim 2 further comprising:
rotating the first wave plate to adjust an intensity of the second laser beam.

8. The method of claim 1 further comprising:
adjusting a distance of the second optical path relative to a distance of the first optical path to adjust the laser pulse delay time between the first and second laser pulses.

9. A laser system for removing material from a solar cell being fabricated, the laser system comprising:
a single pulse laser source configured to generate a single pulse laser beam;
a multi-pulse generator outside a housing of the single pulse laser source, the multi-pulse generator being configured to convert the single pulse laser beam to a multi-pulse laser beam;
a laser scanner configured to scan the multi-pulse laser beam across a solar cell substrate; and
a stage supporting the solar cell substrate.

10. The laser system of claim 9 wherein the multi-pulse generator further comprises:
a first half wave plate inline with the single pulse laser beam; and
a first polarizing beam splitter receiving the single pulse laser beam from the first half wave plate, the first polarizing beam splitter being configured to split the single pulse laser beam into a first laser beam directed onto a first optical path and a second laser beam directed onto a second optical path.

11. The laser system of claim 10 wherein the multi-pulse generator further comprises a carriage assembly configured to adjust a distance of the second optical path.

12. The laser system of claim 10 wherein the multi-pulse generator further comprises:
a second polarizing beam splitter configured to recombine the first laser beam and the second laser beam into the multi-pulse laser beam.

13. The laser system of claim 12 wherein the multi-pulse generator further comprises:
a second half wave plate configured to receive the first laser beam from the first polarizing beam splitter, the second half wave plate being inline with the first laser beam and between the first and second polarizing beam splitters.

14. The laser system of claim 13 wherein the multi-pulse generator further comprises:
a third half wave plate configured to receive the second laser beam and being inline with the second laser beam and the second polarizing beam splitter.

15. The laser system of claim 14 further comprising:
a first turning mirror configured to reflect the second laser beam onto a second turning mirror; and
the second turning mirror.

16. The laser system of claim 15 wherein the first turning mirror and the second turning mirror are movably supported on rails.

17. A method of removing material from a solar cell being fabricated, the method comprising:
firing a single pulse laser beam from a single pulse laser source, the single pulse laser beam comprising a single laser pulse fired at a pulse repetition rate;
converting the single pulse laser beam into a multi-pulse laser beam comprising bursts of laser pulses at a burst repetition rate, each burst of laser pulses comprising a plurality of laser pulses;
scanning the multi-pulse laser beam onto a solar cell; and
impinging the multi-pulse laser beam onto a material on the solar cell to remove portions of the material.

18. The method of claim 17 wherein converting the single pulse laser beam into the multi-pulse laser beam comprises:
splitting the single pulse laser beam into a first laser beam and a second laser beam;
directing the first laser beam along a first optical path;
directing the second laser beam along a second optical path that is longer than the first optical path; and
recombining the first and second laser beams into the multi-pulse laser beam.

19. The method of claim 18 wherein a first beam splitter splits the single pulse laser beam into the first laser beam and the second laser beam.

20. The method of claim 19 wherein a second beam splitter recombines the first and second laser beams into the multi-pulse laser beam.

* * * * *